United States Patent [19]

Ikeno et al.

[11] 4,050,126

[45] Sept. 27, 1977

[54] METHOD FOR ADJUSTING FREQUENCY-TEMPERATURE CHARACTERISTIC OF GT CUT QUARTZ OSCILLATOR

[75] Inventors: Hitoshi Ikeno, Koganei; Mitsuyuki Sugita, Ichikawa; Hirofumi Yanagi, Tokyo, all of Japan

[73] Assignee: Kabushiki Kaisha Seikosha, Japan

[21] Appl. No.: 721,783

[22] Filed: Sept. 9, 1976

[30] Foreign Application Priority Data

Sept. 10, 1975 Japan .................... 50-109803

[51] Int. Cl.² ............................... H01L 41/22
[52] U.S. Cl. .................... 29/25.35; 29/593; 219/121 LM; 310/312
[58] Field of Search ............. 29/25.35, 593; 219/121 LM, 121 L; 310/9.5, 9.7

[56] References Cited

U.S. PATENT DOCUMENTS 3,913,195   10/1975   Beaver ........................... 29/25.35

Primary Examiner—Carl E. Hall
Attorney, Agent, or Firm—Robert E. Burns; Emmanuel L. Lobato; Bruce L. Adams

[57] ABSTRACT

A method of adjusting the frequency and temperature coefficient of a GT cut quartz oscillator comprises starting with a blank of approximately the frequency desired. An electrode film is deposited on the front and rear faces of the blank. The side ratio between a longer side and a shorter side is adjusted to obtain a zero temperature coefficient. Thereafter portions of the electrode film along the longer sides of the oscillator are removed to reduce the area of the electrode film so as to obtain the desired frequency without changing the side ratio and thus without disturbing the zero temperature coefficient.

6 Claims, 9 Drawing Figures

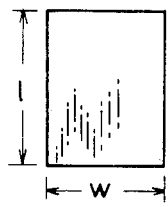
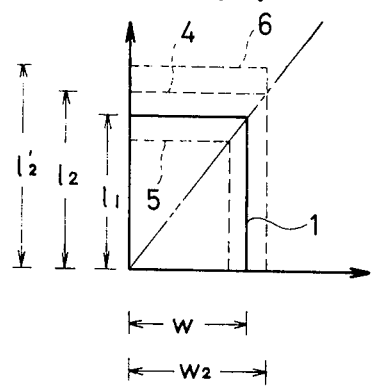
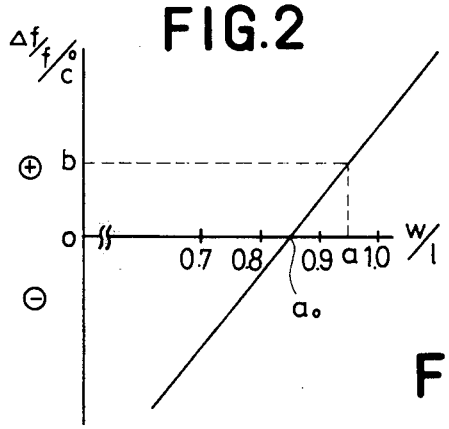
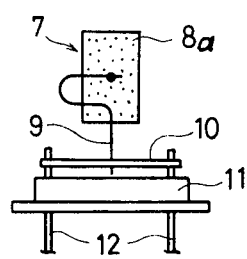
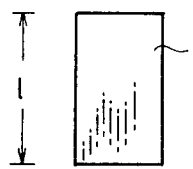
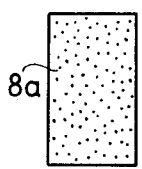
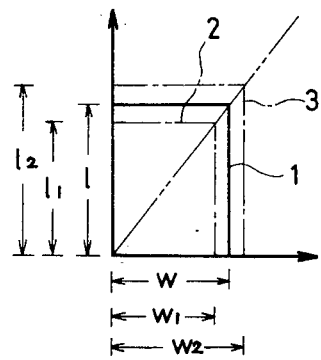
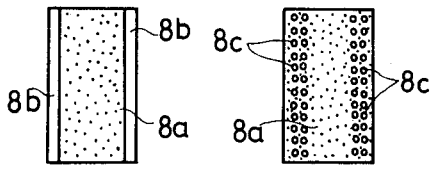

METHOD FOR ADJUSTING FREQUENCY-TEMPERATURE CHARACTERISTIC OF GT CUT QUARTZ OSCILLATOR

FIELD OF INVENTION

The present invention relates to a method for adjusting the frequency-temperature characteristic of a GT cut quartz oscillator.

BACKGROUND OF INVENTION

The frequency-temperature characteristic of a GT cut quartz oscillator is a function of the coupling between a shorter side vibration and a longer side vibration. The coupling state is changed by polishing a shorter side or a longer side of the oscillator. The best temperature characteristic is attained at a certain side ratio (the ratio between the shorter side and the longer side). In particular, a GT cut quartz oscillator employs the shorter side vibration as the principal vibration. A feature of the oscillator is that the frequency does not change materially even when the longer side direction is adjusted and that the adjustment of frequency and the adjustment of the temperature coefficient can be independently performed.

In accordance with the prior method of adjusting the frequency-temperature characteristic of a GT cut quartz oscillator, an oscillator blank which is slightly lower in frequency and more "negative" in temperature coefficient than the desired oscillator is first prepared. While checking the temperature characteristic of the oscillator, the longer side is polished so as to adjust the temperature coefficient to zero. Both sides of the oscillator are then polished so as to reduce the size of the oscillator while keeping the same shape in order to attain the desired frequency. The fine adjustment is laborious since it is very difficult to make the adjustment so as to satisfy both the temperature coefficient and the frequency.

SUMMARY OF INVENTION

It is an object of the present invention to eliminate the disadvantages of the prior art method for adjusting the frequency-temperature characteristic of a GT cut oscillator and to make it possible to adjust the proper frequency of the oscillator without the changing the side ratio of the oscillator in the final frequency adjustment.

In accordance with the invention a blank of approximately the desired frequency is prepared. An electrode film is deposited on front and rear faces of the blank. The side ratio between a longer side and a shorter side of the oscillator is adjusted to obtain a zero temperature coefficient. Thereafter, the area of the electrode film is adjusted so as to obtain the desired frequency without changing the side ratio and thus without disturbing the zero temperature coefficient of the oscillator.

BRIEF DESCRIPTION OF DRAWINGS

The nature, objects and advantages of the invention will be more fully understood from the following description in accordance with the accompanying drawings in which:

FIG. 1 is a front view of a GT cut quartz oscillator;
FIG. 2 is a graph representing the relationship between the side ratio and the temperature coefficient;
FIG. 3 is a graphical view representing GT cut quartz oscillators all of which are equal in the temperature coefficient.
FIG. 4 is a graphical view representing allowable adjustment ranges of the GT cut quartz oscillator;
FIG. 5 is a schematic view showing the mounting of the oscillator on a base;
FIG. 6 is a front view of a quartz blank;
FIG. 7 is a front view of the quartz blank with an electrode film deposited on the entire face area thereof and;
FIGS. 8 and 9 are front views showing the electrode film partially removed to adjust the frequency of the oscillator.

DESCRIPTION OF PREFERRED EMBODIMENT

The relationship between the side ratio and the temperature coefficient will be explained with reference to FIGS. 1 and 2. In FIG. 1 there is shown a front view of a GT cut quartz oscillator having a length $l$ and a width $w$. FIG. 2 is a graph which shows the temperature characteristic of a GT cut quartz oscillator in which the ordinates represent the temperature coefficient and the abscissae represent the side ratio $w/l$. Usually the temperature coefficient becomes zero when the side ratio $w/l$ is approximately 0.85. As will be seen from FIG. 2 within a certain range of dimensions all oscillators having a side ratio of $a$ exhibit a temperature coefficient of $b$.

FIG. 3 shows examples of oscillators whose temperature coefficients are zero and whose side ratios are $a_o$. The oscillators 1, 2 and 3 represented by 3 similar shapes are identical in the side ratio and equal in temperature coefficient. However, the natural frequencies of the respective oscillators differ and are determined by the magnitudes of the lengths $w$, $w_1$ and $w_2$ in the shorter side direction. The natural frequencies of the oscillators are higher in the order of oscillator 2, oscillator 1 and oscillator 3.

A method for adjusting the frequency and temperature coefficient of an oscillator as it has heretofore been carried out will now be described. Referring to FIG. 4 an oscillator 1 indicated by a solid line is a desired oscillator to be fabricated. As shown in FIG. 2 it is an oscillator whose temperature coefficient is zero (side ratio of small $a_o$) and which has a nominal frequency of $f_1$. Here $a_o = w_1/l_1$.

Oscillators 4 and 5 indicated by broken lines in FIG. 4 are similar in shape to the desired oscillator 1. The natural frequency of the oscillator 5 is higher than that of oscillator 1 while the natural frequency of the oscillator 4 is lower than that of oscillator 1 ($f_5 > f_1 > f_4$). An oscillator 6 indicated by broken lines in FIG. 4 is one whose width $w_2$ is equal to that of the oscillator 4 while the length is somewhat greater than that of oscillator 4 ($l_2' > l_2$). With this relationship the temperature coefficient of oscillator 6 is negative with respect to oscillator 4 and the natural frequencies of ocillators 4 and 6 are substantially equal ($f_4 \doteq f_6$).

An example of a method for adjusting the frequency-temperature characteristic of a GT cut quartz oscillator as heretofore carried out will now be described with reference to FIG. 4.

1. The oscillator 6 shown by broken lines in FIG. 4 which is slightly lower in frequency and more negative in the temperature coefficient than the desired oscillator is prepared. In this case, $f_1 > f_6$.

2. While checking the temperature characteristic of the oscillator, the longer side $l_{2'}$ is polished so as to reduce the length until the temperature coefficient is adjusted to zero. This results in the oscillator 4 indicated by broken lines in FIG. 4 with a length $l_2$. In this case the relationship $f_1 > f_4$ still holds.

3. The oscillator 4 indicated by broken lines in FIG. 4 is reduced in size while maintaining the same shape by polishing both the longer side and shorter side of the oscillator so as to attain the finished shape of oscillator 1 represented by solid lines in FIG. 4 whose natural frequency $f_1$ and whose temperature coefficient is zero.

In making the final proper frequency adjustment of the GT cut quartz oscillator in this manner by performing the frequency adjustment after the temperature coefficient adjustment, the side ratio changes and the temperature coefficient changes by polishing only the width $w_2$ into the width $w_1$ and thus achieving the desired frequency, and hence, also the length $l_2$ must be polished to the $l_1$. The fine adjustment is laborious and it is very difficult to make the adjustment so as to satisfy both the temperature coefficient and the frequency.

These disadvantages of the prior art method are eliminated by the method of the present invention which enables one to adjust the frequency of the oscillator to attain the desired frequency without changing the side ratio of the oscillator and without changing the side ratio which has previously been adjusted to attain a zero temperature coefficient.

An embodiment of the invention will now be described with reference to the drawing.

A quartz blank 7 is formed to the shape illustrated in FIG. 6 so as to have a natural frequency slightly lower than the desired frequency and a negative temperature coefficient. For example the blank may have the dimensions of $l = 9.35$ mm., $w = 8.03$ mm. and $t = 0.65$ mm. The opposite faces of the blank are then coated with an electrode film 8a as illustrated in FIG. 7. The electrode film covers the entire area of the electrode face. The electrode film may for example be made of Au and has a thickness of about A. The film may be applied by the vacuum evaporation method.

The blank 7 with the electrode film 8a thereon is then mounted on a supporting substrate 10 by a supporting spring 9 as illustrated in FIG. 5. The substrate 10 is mounted on a base 11 provided with mounting pins 12. With the oscillator assembled as shown in FIG. 5 the temperature characteristic is measured. One side in the longer side direction is polished in this assembled state in order to adjust the temperature coefficient to zero.

The frequency of the oscillator is then adjusted to attain the proper frequency by partially removing the electrode film 8a from the outer peripheral parts of the oscillator in the shorter side direction by the use of a laser, air abrasive or the like. The electrode film is removed from a strip along the longer sides of the oscillator as indicated at 8b in FIG. 8 or is removed in selected areas or spots in marginal portions along the longer sides of the oscillator as indicated at 8c in FIG. 9. FIG. 8 shows the state at which the outer peripheral part of the electrode of FIg. 7 is trimmed by about 1.00mm. on each of the front and rear surfaces. In the present example the frequency variation was approximately $\Delta f/f = +500$ P. P. M. When the frequency is adjusted in this manner the side ratio which controls the temperature characteristic is not changed. Therefore the temperature coefficient is scarcely changed and the conformance of the frequency of the GT cut quartz oscillator to the desired frequency becomes extraordinarily easy.

Regarding the last conformance of the frequency to the desired frequency, the method described above may be replaced by a method wherein mass is added to the electrode 8a by means of a getter.

As set forth above, after the frequency-temperature coefficient is adjusted to zero in the GT cut quartz oscillator having an electrode film, the electrode film is trimmed for example with a laser in order to adjust the frequency of the oscillator to the desired frequency. The adjusting process is thus rendered very easy and simple. Accordingly the causes for many extreme difficulties that have been undergone in the adjustment of the GT cut quartz oscillators in the past and having incurred a low yield and a high cost, can be fully eliminated.

While a preferred embodiment of invention has been described with reference to the accompanying drawings, it will be understood by those skilled in the art that many modifications and variations may be made and hence the invention is in no way limited to the illustrated embodiment.

What we claim is:

1. A method of adjusting the frequency-temperature coefficient and the frequency of a GT cut quartz oscillator which comprises providing a GT cut quartz crystal blank of approximately the frequency desired, depositing an electrode film on front and rear faces of said blank, adjusting the side ratio between a longer side and a shorter side of said blank while measuring the frequency-temperature coefficient of said blank to obtain a zero frequency-temperature coefficient and thereafter adjusting the area of said electrode film on said blank to obtain the desired frequency without changing said side ratio of said blank and thus without disturbing said zero frequency-temperature coefficient.

2. A method according to claim 1 in which portions of said electrode film along opposite longer side edges of the oscillator are removed to decrease the width of said electrode film in the direction of width of said oscillator.

3. A method according to claim 2, in which said electrode film is removed in spots.

4. A method according to claim 1 in which portions of said electrode film are removed with a laser beam.

5. A method of adjusting the frequency and the frequency-temperature coefficient of a GT cut quartz crystal oscillator which comprises:

forming a GT cut rectangular quartz crystal blank having a natural frequency slightly lower than the desired frequency and a negative frequency-temperature coefficient, depositing an electrode film on front and rear faces of said blank, mounting said blank on a supporting substrate, progressively removing material from an edge of said mounted blank while measuring the frequency-temperature coefficient of said blank to adjust the ratio between longer and shorter sides of said blank to adjust the frequency-temperature coefficient of said blank to zero, and thereafter adjusting the area of said electrode film on said blank to obtain the desired frequency without changing said side ratio of said blank and thus without disturbing said zero frequency-temperature coefficient.

6. A method of adjusting the frequency and the frequency-temperature coefficient of a GT cut quartz crystal oscillator which comprises:

forming a GT cut rectangular quartz crystal blank having a natural frequency slightly higher than the desired frequency and a negative frequency-temperature coefficient, depositing an electrode film on front and rear faces of said blank, mounting said blank on a supporting substrate, progressively removing material from an edge of said mounted blank while measuring the frequency-temperature coefficient of said blank to adjust the ratio between longer and shorter sides of said blank to adjust the frequency-temperature coefficient of said blank to zero, and thereafter adding mass along opposite longer side edges of said blank to obtain the desired frequency without changing said side ratio of said blank and thus without disturbing said zero frequency-temperature coefficient.

* * * * *